United States Patent
Boeuf et al.

(10) Patent No.: US 10,381,478 B2
(45) Date of Patent: Aug. 13, 2019

(54) METHOD OF LOCALIZED MODIFICATION OF THE STRESSES IN A SUBSTRATE OF THE SOI TYPE, IN PARTICULAR FD SOI TYPE, AND CORRESPONDING DEVICE

(71) Applicants: STMicroelectronics (Crolles 2) SAS, Crolles (FR); Commissariat A L'Energie Atomique et aux Energies Alternatives, Paris (FR)

(72) Inventors: Frederic Boeuf, Le Versoud (FR); Olivier Weber, Grenoble (FR)

(73) Assignees: STMicroelectronics (Crolles 2) SAS, Crolles (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/483,299

(22) Filed: Apr. 10, 2017

(65) Prior Publication Data

US 2017/0213910 A1 Jul. 27, 2017

Related U.S. Application Data

(62) Division of application No. 14/220,542, filed on Mar. 20, 2014, now Pat. No. 9,653,538.

(30) Foreign Application Priority Data

Mar. 21, 2013 (FR) ...................................... 13 52535

(51) Int. Cl.
*H01L 23/48* (2006.01)
*H01L 29/04* (2006.01)
(Continued)

(52) U.S. Cl.
CPC .... *H01L 29/7847* (2013.01); *H01L 21/02381* (2013.01); *H01L 21/02422* (2013.01);
(Continued)

(58) Field of Classification Search
CPC ........... H01L 29/66628; H01L 29/1054; H01L 29/42384; H01L 21/84; H01L 29/7846;
(Continued)

(56) References Cited

U.S. PATENT DOCUMENTS 6,063,686 A    5/2000  Masuda et al.
7,652,346 B2 * 1/2010  Suzuki ............ H01L 21/823807
                                              257/499
(Continued)

OTHER PUBLICATIONS

INPI Search Report and Written Opinion for FR 1352535 dated Dec. 20, 2013 (7 pages).
(Continued)

*Primary Examiner* — Mary A Wilczewski
*Assistant Examiner* — Tsz K Chiu
(74) *Attorney, Agent, or Firm* — Crowe & Dunlevy

(57) ABSTRACT

A substrate of the silicon on insulator type includes a semi-conducting film disposed on a buried insulating layer which is disposed on an unstressed silicon support substrate. The semi-conducting film includes a first film zone of tensile-stressed silicon and a second film zone of tensile-relaxed silicon. Openings through the buried insulating layer permit access to the unstressed silicon support substrate under the first and second film zones. An N channel transistor is formed from the first film zone and a P channel transistor is formed from the second film zone. The second film zone may comprise germanium enriched silicon forming a compressive-stressed region.

7 Claims, 4 Drawing Sheets

(51) Int. Cl.
*H01L 29/78* (2006.01)
*H01L 21/02* (2006.01)
*H01L 21/84* (2006.01)
*H01L 27/12* (2006.01)
*H01L 29/06* (2006.01)
*H01L 21/762* (2006.01)
*H01L 21/8238* (2006.01)
*H01L 27/092* (2006.01)
*H01L 29/16* (2006.01)
*H01L 29/161* (2006.01)

(52) U.S. Cl.
CPC .. *H01L 21/02532* (2013.01); *H01L 21/02639* (2013.01); *H01L 21/02667* (2013.01); *H01L 21/76264* (2013.01); *H01L 21/76283* (2013.01); *H01L 21/823807* (2013.01); *H01L 21/84* (2013.01); *H01L 27/092* (2013.01); *H01L 27/12* (2013.01); *H01L 27/1203* (2013.01); *H01L 29/0611* (2013.01); *H01L 29/0642* (2013.01); *H01L 29/16* (2013.01); *H01L 29/161* (2013.01); *H01L 29/7838* (2013.01)

(58) Field of Classification Search
CPC ............. H01L 27/1203; H01L 29/7848; H01L 21/76243; H01L 21/823807; H01L 21/823878; H01L 29/7842; H01L 27/1207
See application file for complete search history.

(56) References Cited

U.S. PATENT DOCUMENTS

| | | |
|---|---|---|
| 8,236,636 B2 | 8/2012 | Yin et al. |
| 9,252,208 B1 | 2/2016 | Morin et al. |
| 2002/0064006 A1* | 5/2002 | Hasegawa ............. B82Y 10/00 360/324.12 |
| 2005/0116290 A1 | 6/2005 | de Souza et al. |
| 2006/0131699 A1* | 6/2006 | Raab ................. H01L 21/76243 257/627 |
| 2006/0292770 A1* | 12/2006 | Wu ......................... H01L 21/84 438/187 |
| 2007/0018328 A1* | 1/2007 | Hierlemann .... H01L 21/823807 257/762 |
| 2007/0281446 A1 | 12/2007 | Winstead et al. |
| 2007/0290264 A1 | 12/2007 | Sugii et al. |
| 2008/0258254 A1 | 10/2008 | Boeuf |
| 2008/0261355 A1* | 10/2008 | Goktepeli ......... H01L 21/31155 438/154 |
| 2009/0108301 A1 | 4/2009 | Yin et al. |
| 2013/0020638 A1* | 1/2013 | Thompson ...... H01L 21/823412 257/338 |
| 2013/0065366 A1 | 3/2013 | Thomas et al. |
| 2014/0077300 A1 | 3/2014 | Noel et al. |

OTHER PUBLICATIONS

L. Csepregi, E.F. Kennedy and J.W. Mayer—T.W. Sigmon, "Substrate-Orientation Dependence of the Epitaxial Regrowth Rate From Si-Implanted Amorphous Si" 1978 American Institute of Physics.
G. Bidal, F. Boeuf, "First CMOS Integration of Ultra Thin Body and BOX (UTB) Structures on Bulk Direct Silicon Bonded (DSB) Wafer with Multi-Surface Orientations", IEDM09-677 IEEE 2009.

* cited by examiner ance with this aspect.

METHOD OF LOCALIZED MODIFICATION OF THE STRESSES IN A SUBSTRATE OF THE SOI TYPE, IN PARTICULAR FD SOI TYPE, AND CORRESPONDING DEVICE

CROSS REFERENCE TO RELATED APPLICATIONS

This application is a divisional application from U.S. application patent Ser. No. 14/220,542 filed Mar. 20, 2014, which claims priority from French Application for Patent No. 1352535 filed Mar. 21, 2013, the disclosures of which are incorporated by reference.

TECHNICAL FIELD

The invention relates to integrated circuits, and especially to substrates of the Silicon On Insulator (SOI) type, more particularly to substrates of the Fully Depleted Silicon On Insulator (FD SOI) type, partially stressed with a view to the co-integration of NMOS and PMOS transistors.

BACKGROUND

When an NMOS transistor exhibits a tensile-stressed channel, the mobility of the carriers increases as does the current drawn, thereby increasing transistor performance. On the other hand, a tensile-stressed channel degrades the performance of a PMOS transistor especially as regards the mobility of the holes which decreases.

Today, in so-called "massive substrate" technologies, techniques exist for tensile-stressing the channels of NMOS transistors.

Substrates of the SOI type also exist, in which the silicon film, which rests on the buried insulating layer supported by a silicon support substrate, for example a trough, is already tensile-stressed. But, though this is advantageous for the production of NMOS transistors, it presents a drawback for the production of PMOS transistors.

SUMMARY

According to one mode of implementation, it is proposed to locally modify the stresses in a substrate of the initially tensile-stressed SOI type so as to be able to produce PMOS transistors therein, and to do so in a manner that is compatible with thin films such as those used in FD SOI technology.

According to one mode of implementation, it is also proposed to render compressive-stressed, those parts of the semi-conducting film in which the PMOS transistors will be produced.

According to one mode of implementation, it is also proposed to relax the stresses of an initially tensile-stressed silicon zone independently from the crystallographic orientation of said silicon zone.

According to one mode of implementation, it is also proposed to form a compressive-stressed film zone to improve the performance of a PMOS transistor that will be produced in such a compressed film zone, independently from the crystallographic orientation of the film.

According to one aspect, there is proposed a method of localized modification of the stresses in a substrate of the initially tensile-stressed silicon on insulator type; such a substrate comprises an initially tensile-stressed semi-conducting silicon film disposed on a so-called buried insulating layer itself disposed on an unstressed silicon support substrate. The method comprises: a formation of at least one opening in the initially stressed silicon film and in the underlying buried insulating layer until the unstressed silicon support substrate is reached, a silicon epitaxy in the at least one opening from unstressed silicon support substrate so as to fill in the at least one opening, a localized amorphization of a zone of the silicon film including the at least one epitaxied zone, a recrystallization of the at least one amorphized zone by a solid-phase epitaxy from the unstressed silicon part situated in the at least one opening and in contact with the amorphized zone, so as to obtain in the stressed silicon film at least one localized film zone comprising tensile-relaxed silicon.

Thus, according to this aspect, the obtaining of the localized tensile-relaxed silicon zone is obtained through the combination of a localized amorphization of a zone of the silicon film and of a recrystallization of this zone from a silicon seed which is situated under this amorphized zone, and more precisely in the part of the opening filled in by epitaxy, situated between portions of the buried insulating layer, independently from the crystallographic orientation of said silicon zone and without necessarily changing the crystallographic orientation of said zone.

And, this is particularly beneficial for SOI technologies in which the silicon film may be relatively slender, and most particularly in FD SOI technologies in which the silicon film is particularly slender, typically of the order of a few nanometers. Indeed, in this case, the localized amorphization of the film leads to an amorphization throughout the depth and it is therefore then necessary to have under this amorphized zone, a silicon seed in contact with this amorphized zone so as to allow recrystallization by solid-phase epitaxy.

An FD SOI technology offers properties of low consumption and of operation at very low supply voltage. Moreover, in the silicon support substrate (a trough for example) provision is made to dispose buried control electrode regions under the buried insulating layer (BOX) so as to be able to also bias the channels of the MOS transistors produced in the semi-conducting film. And, these buried electrode regions are biased by way of contact wells linking the troughs to the upper face of the film.

And, according to one mode of implementation, each opening which will allow the recrystallization of the corresponding amorphized zone, corresponds to a well that is intended to allow contact with silicon support substrate (trough, for example).

Stated otherwise, to define sites of the openings, it is advantageously possible to use the same mask as that intended to define the sites of these contact wells. This consequently results in simplified implementation of the method.

According to one mode of implementation, it is furthermore particularly advantageous to form a silicon-germanium alloy in at least one part of the tensile-relaxed localized zone so as to form a compressive-stressed film zone. This will make it possible to further improve the performance of a PMOS transistor that will be produced in a compressed film zone such as this.

According to another aspect, there is also proposed a method for producing a transistor of the N channel type and a transistor of P channel type, for example NMOS and PMOS transistors, in a substrate of initially stressed silicon on insulator type, comprising a production of the P channel transistors in the at least one localized tensile-relaxed silicon zone obtained by the method defined hereinabove or in the compressive-stressed film zone obtained by the method defined hereinabove, and a production of the N channel transistors in the film zone or zones comprising tensile-stressed silicon.

According to another aspect, there is proposed a device comprising a substrate of the silicon on insulator type, the substrate comprising a semi-conducting film disposed on a so-called buried insulating layer itself disposed on an unstressed silicon support substrate, the semi-conducting film comprising at least one first film zone comprising tensile-stressed silicon and at least one second film zone comprising tensile-relaxed silicon, the buried insulating layer comprising at least one opening under the at least one second film zone, the opening comprising unstressed silicon.

The substrate can advantageously be of the fully depleted silicon on insulator type.

Moreover, according to one embodiment, at least one part of the at least one second film zone can comprise a silicon-germanium alloy so as to form a compressive-stressed film part.

The device can thus comprise at least one NMOS transistor produced in and on the at least one first film zone and at least one PMOS transistor produced in and on the second film zone.

BRIEF DESCRIPTION OF THE DRAWINGS

Other advantages and characteristics of the invention will be apparent on examining the wholly non-limiting detailed description of modes of implementation and production, and appended drawings in which.

DETAILED DESCRIPTION OF THE DRAWINGS

Figure 1:
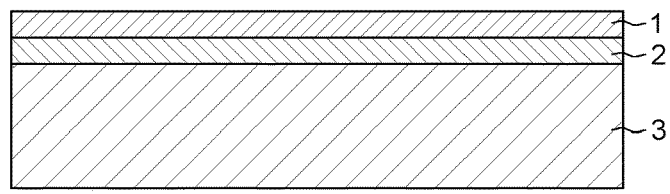
FIGS. 1 to 16 deal with various modes of implementation of the method and of production of a device according to the invention.

In FIG. 1, the reference DIS designates a device, for example a semi-conductor wafer comprising a lower region, or support substrate, 3 of unstressed silicon. This region 3 may be for example a trough.

This region 3 can generally comprise intrinsic, that is to say undoped, silicon. That said, in practice, a low amount of dopants always exists but, when this amount of dopants is less than $10^{15}$ atoms per $cm^3$, one then nonetheless speaks of intrinsic silicon.

This lower silicon region 3 is surmounted by a buried insulating layer 2 commonly referred to by the person skilled in the art by the name "BOX" for buried oxide layer. This insulating region may be, for example, formed of silicon dioxide.

Atop this buried insulating layer 2 is situated a semi-conducting film 1 formed here of tensile-stressed silicon. It is therefore seen here that the film 1 forms part of a substrate of the silicon on insulator (SOI) type.

In a fully-depleted (FD) SOI technology, the thickness of this film 1 is of the order of a few nanometers. And, it is in this film 1 that NMOS and PMOS transistors will be produced.

A mode of implementation of the method making it possible to locally relax the tensile stresses in the semi-conducting film 1 will now be described while referring more particularly to FIGS. 2 to 5.

Figure 2:
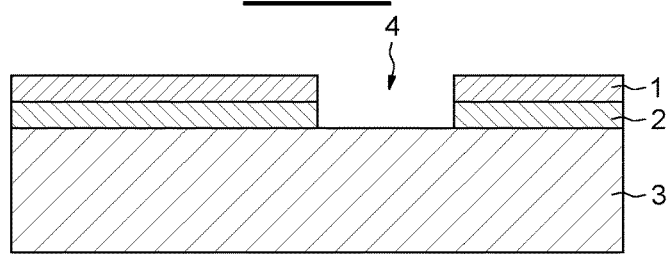

In this regard, as illustrated in FIG. 2, an orifice or an opening 4 is formed in the film 1, typically by a conventional etching operation, which is extended into the buried insulating layer 2 so as to emerge on the lower region 3 of unstressed silicon.

Carried out thereafter (FIG. 3) is a conventional epitaxy known per se 30 of silicon so as to fill in the opening 4 with silicon which this time is unstressed because it grew from the unstressed silicon region 3.

Carried out thereafter (FIG. 4) is a localized amorphization of the film 1 in a zone containing at least one part of the opening with the epitaxied silicon, so as to form an amorphized zone 11 in contact with the epitaxied silicon that filled in the opening. The definition of the site of this zone is performed in a conventional manner by a mask and the amorphization comprises, in a conventional manner, a bombardment of the corresponding silicon zone with atoms, for example argon or germanium.

On completion of this amorphization, the film 1 consequently comprises a localized amorphized zone 11 which is in contact with the unstressed silicon 31 resulting from the epitaxy 30 and situated between the portions of insulating layer 2.

The film 1 also comprises on either side of this amorphized zone 11 a film zone 10 formed of tensile-stressed silicon.

The following step (FIG. 5) comprises a recrystallization of the amorphized zone 11 by a solid-phase epitaxy 50. Such an epitaxy is known by the person skilled in the art under the acronym "SPER" ("Solid Phase Epitaxy Regrowth").

Such an epitaxy is obtained from the unstressed silicon seed 31 by heating, typically between 400 and 1000° C. for a duration that may vary between a minute and an hour depending on the volume of the amorphized zone to be recrystallized. The person skilled in the art may for all useful purposes refer, as regards especially orders of magnitude of the recrystallization speeds of amorphized silicon, to the following article: "Substrate-orientation dependence of the epitaxial regrowth rate from Si-implanted amorphous Si", L. Csepregi et al, J. Appl. Phys. 49(7), pp 3906-3911, July 1978 (the disclosure of which is incorporated by reference).

On completion of this recrystallization, the film 1 comprises a localized zone 12 of film comprising tensile-relaxed silicon, and a film zone 10 comprising tensile-stressed silicon.

Reference is now made more particularly to FIGS. 6 to 12 to describe an application to the co-integration of NMOS transistors and of PMOS transistors in a substrate of the FD SOI type.

Figure 6:
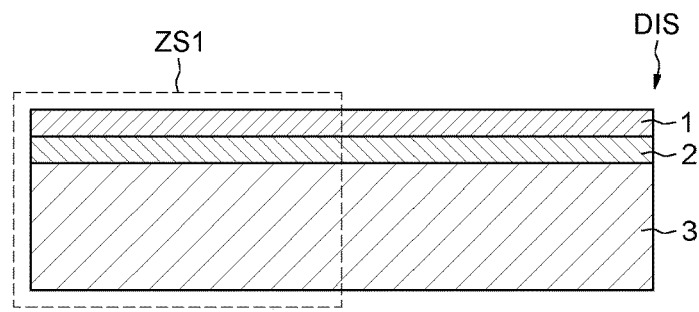
Figure 7:
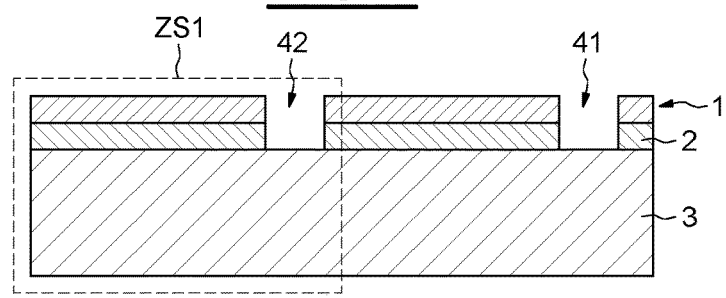

More precisely, as illustrated in FIG. 6, it is desired to produce the NMOS transistors in the zone ZS1 of the initially tensile-stressed film 1 and the PMOS transistors outside this zone ZS1.

The production of two openings or orifices 41 and 42 in the film 1 and the buried insulating layer 2 emerging in the lower silicon region (support substrate) 3 is then carried out (FIG. 7) in a similar manner to what was described with reference to FIG. 2. It should be noted here that the site of these two openings corresponds to the two sites of the future contact wells which will make it possible to contact the lower trough 3 from the front face so as to bias the respective buried electrodes which will be formed by implantation under the insulating layer 2.

Figure 3:
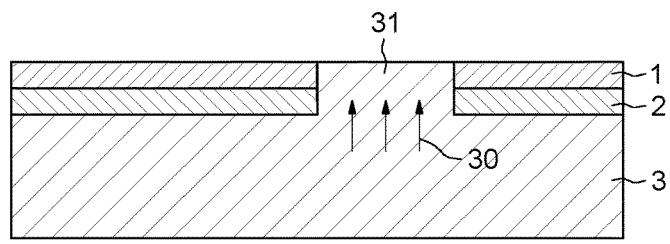
Figure 4:
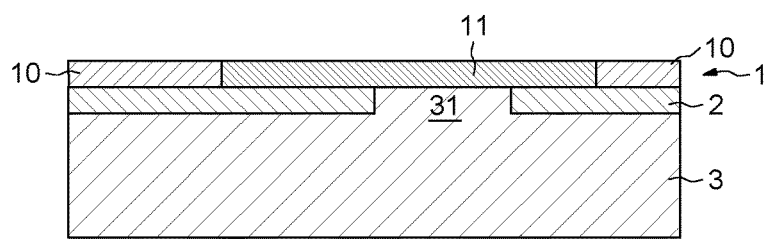
Figure 5:
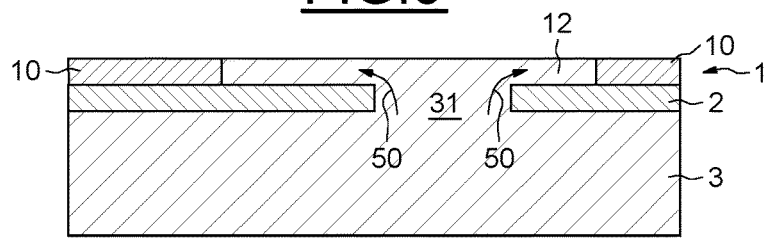
Figure 8:
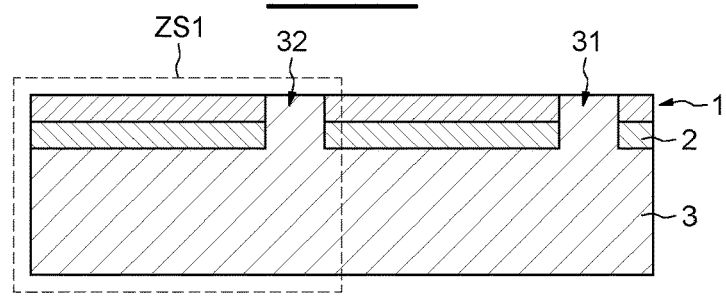

In a way similar to what was described with reference to FIG. 3, a silicon epitaxy is carried out thereafter from the region 3 so as to fill in the openings 41 and 42 with unstressed silicon 31 and 32 (FIG. 8).

Figure 9:
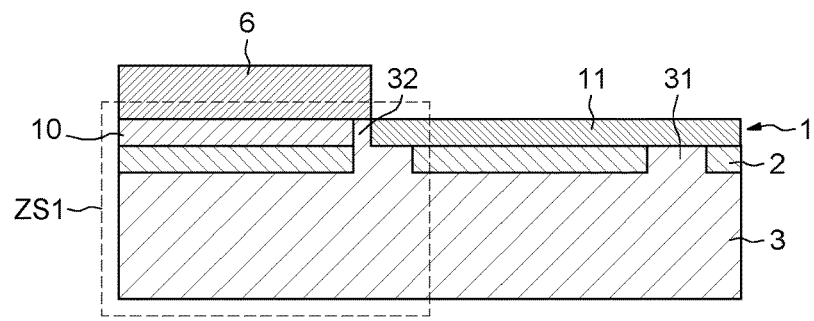

Next, as illustrated in FIG. 9, the zone of stressed silicon 10 of the film 1, intended to receive the NMOS transistor or transistors, is masked with a resin block 6 before carrying out the localized amorphization of the remainder of the film 1.

An amorphized zone 11 in contact especially with the unstressed silicon 31 is therefore obtained.

A recrystallization of the amorphized zone 11 on the basis especially of the unstressed silicon 31 is carried out thereafter (FIG. 10) so as to form a localized zone 12 of film comprising tensile-relaxed silicon.

The conventional production of isolation zones 7 of the shallow trench type for example (shallow trench isolation—STI) is carried out thereafter, so as to electrically isolate the film zones 10 and 12 and to delimit the contact wells 81 and 82 (FIG. 11) which will allow the biasing of the buried electrodes (not represented here for the sake of simplification) from an upper face F1 of the film 1.

Figure 12:
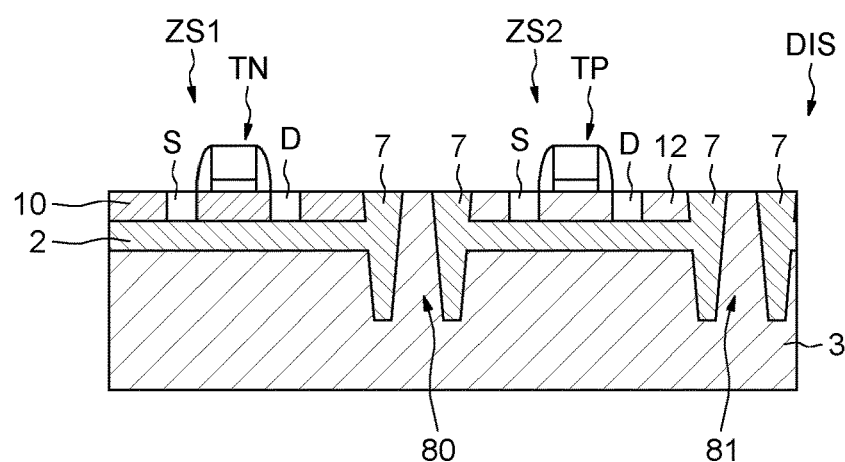
Figure 13:
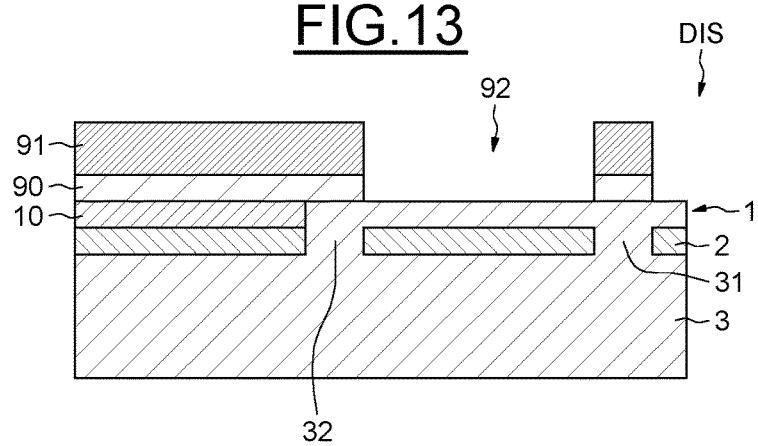

As illustrated in FIG. 12, one or more NMOS transistors TN are produced in the film zone 10 comprising tensile-stressed silicon, the source region S and drain region D of the transistor or transistors being produced by an epitaxy followed by an implantation of dopants, or by a semi-conductor (for example Silicon) epitaxy doped in-situ (for example Carbon or Phosphorus).

Moreover, the PMOS transistor or transistors TP are produced in the tensile-stress-relaxed silicon zone 12. In the same manner as for the NMOS TN, the source S and drain D regions will be produced by implantation of dopants, or by a semi-conductor (for example Silicon or Germanium Silicon) epitaxy doped in-situ (for example Boron).

Of course if the amorphized silicon region 11 is too long, it may happen that the recrystallization of this zone is incomplete. In this case, provision will be made beforehand for several "seeding" orifices, under this large amorphized zone, and this will ultimately lead to several zones 12 separated by contact wells, in which the PMOS transistors will be produced.

FIGS. 13 to 16 schematically illustrate another implementation making provision this time for the production of a localized zone of compressive-stressed film.

Figure 10:
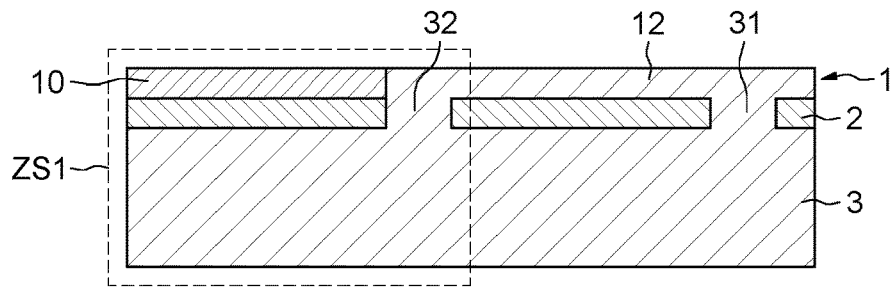
Figure 11:
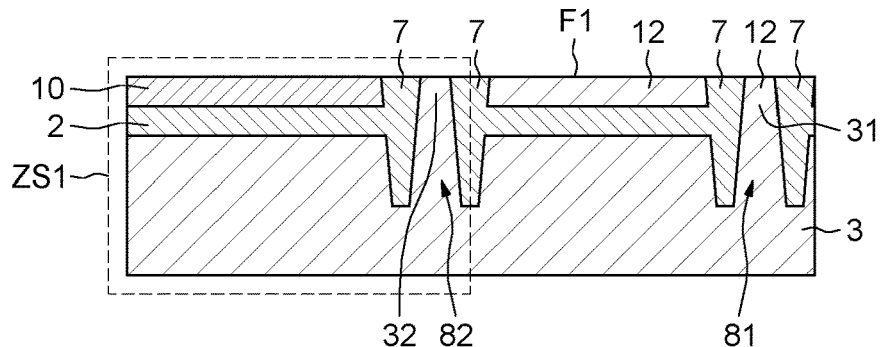

More precisely, a hard mask layer 90 and a resin block 91 are deposited on the structure illustrated in FIG. 10.

The site of an orifice or of an opening 92 making it possible to clear the part of the tensile-relaxed silicon zone 12 in which the PMOS transistors will be produced is thereafter delimited by masking.

Figure 14:
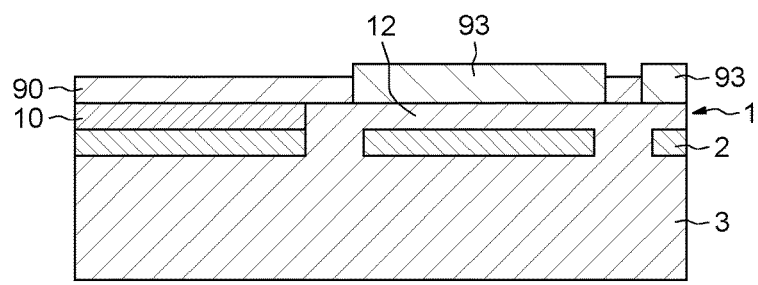

A layer 93 of a germanium silicon alloy is grown thereafter (FIG. 14). Such a step of SiGe epitaxy is conventional and known per se. Next, a step of condensation of this germanium silicon is carried out, leading to surface oxidation of the germanium silicon and to diffusion of the germanium atoms in the underlying silicon layer 12.

Such a condensation step, conventional and known per se, is performed by heating the epitaxied germanium silicon for example to a temperature of 900° C. to 1100° C. for a duration of the order of a second to a few minutes.

Figure 15:
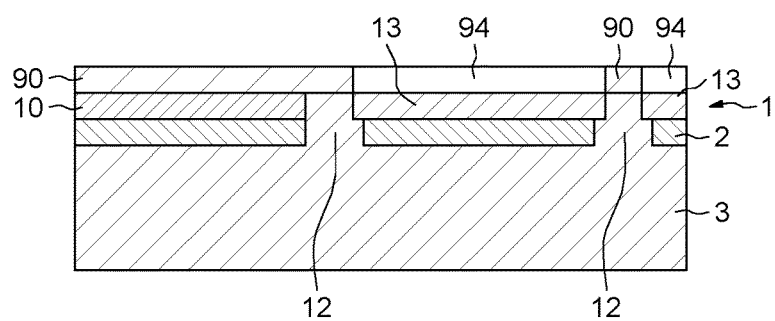
Figure 16:
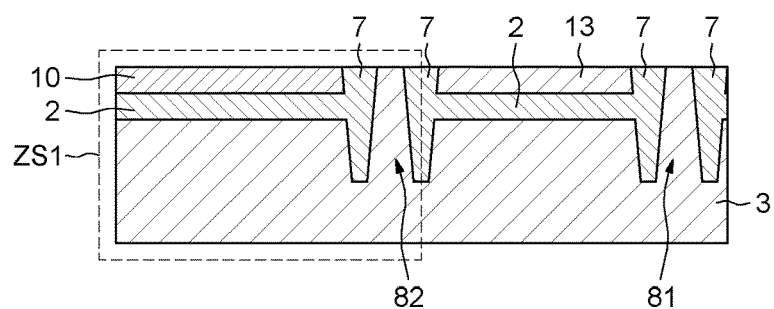

On completion of this condensation step, the device DIS comprises a layer of compressive-stressed germanium silicon surmounted by a silicon dioxide layer 94 (FIG. 15).

A removal of the hard mask 90 and of the silicon dioxide layer 94 is carried out thereafter (FIG. 16) by a conventional cleaning, for example with the aid of hydrofluoric acid.

After production of the isolating trenches 7, a device is therefore obtained which comprises in the zone ZS1 a tensile-stressed silicon film 10 in which it will be possible to produce the NMOS transistor or transistors and also a compressive-stressed germanium silicon film 13, in which it will be possible to produce the PMOS transistor or transistors.

It should be noted that a tensile-stressed (resp. compressive-stressed) zone according to one direction is a compressive-stressed (resp. tensile stressed) zone according to a perpendicular direction. As a matter of fact a zone cannot be both tensile-stressed and compressive-stressed according to a same direction.

What is claimed is:

1. A device, comprising:
   a substrate of the silicon on insulator type comprising a semi-conducting film disposed on a buried insulating layer which is disposed on an unstressed silicon support substrate,
   wherein the semi-conducting film comprises at least one first film zone comprising tensile-stressed silicon and at least one second film zone comprising tensile-relaxed silicon,
   an NMOS transistor formed on and in the tensile-stressed silicon of the first film zone; and
   a PMOS transistor formed on and in the tensile-relaxed silicon of the second film zone;
   wherein the buried insulating layer comprises at least one opening under the at least one second film zone, the opening filled with unstressed silicon extending from said unstressed silicon support substrate to the tensile-relaxed silicon of the at least one second film zone to provide a contact well for contacting the unstressed silicon support substrate.

2. The device according to claim 1, wherein the substrate is of the fully depleted silicon on insulator type.

3. The device according to claim 1, wherein at least one part of the at least one second film zone comprises a germanium silicon alloy so as to form a compressive-stressed film part.

4. The device according to claim 1, wherein the at least one second film zone comprises recrystallized amorphous material epitaxially grown from the unstressed silicon support substrate.

5. A device, comprising:
   an unstressed silicon support substrate;
   a buried insulating layer on the unstressed silicon support substrate;
   a first film of tensile-stressed silicon on the buried insulating layer in a first zone;
   an NMOS transistor disposed in and on the first film of tensile-stressed silicon;
   a second film of tensile-relaxed silicon on the buried insulating layer in a second zone;
   a PMOS transistor disposed in and on the second film of tensile-relaxed silicon;
   a first shallow trench isolation surrounding the first film of tensile-stressed silicon;
   a second shallow trench isolation surrounding the second film of tensile-relaxed silicon; and
   wherein a portion of the unstressed silicon support substrate extends between the first shallow trench isolation second shallow trench isolation to provide a contact well extending from the second film of tensile-relaxed silicon to the unstressed silicon support substrate.

6. The device according to claim 5, wherein the second film of tensile-relaxed silicon comprises a germanium silicon alloy so as to form a compressive-stressed film part.

7. The device according to claim 5, wherein the second film of tensile-relaxed silicon is recrystallized amorphous material epitaxially grown from the unstressed silicon support substrate.

* * * * *